United States Patent [19]

Dessoulavy

[11] 4,352,069
[45] Sep. 28, 1982

[54] SWITCHED CAPACITANCE SIGNAL PROCESSOR

[75] Inventor: Roger Dessoulavy, Lausanne, Switzerland

[73] Assignee: Centre Electronique Horloger S.A., Neuchatel, Switzerland

[21] Appl. No.: 103,996

[22] Filed: Dec. 17, 1979

[30] Foreign Application Priority Data

Dec. 18, 1978 [CH] Switzerland ................. 12855/78

[51] Int. Cl.³ ................. G06G 7/12; G06G 7/18
[52] U.S. Cl. ................. 328/127; 307/490; 328/128
[58] Field of Search ................. 328/127, 128, 151; 307/229, 230, 490, 491

[56] References Cited

U.S. PATENT DOCUMENTS

| | | | |
|---|---|---|---|
| 3,249,748 | 5/1966 | Fluhr | 328/127 |
| 3,488,483 | 1/1970 | Freedman | 307/229 |
| 4,059,169 | 11/1977 | Hagen | 328/127 |

OTHER PUBLICATIONS

"Sampled Analog Filtering Using Switched Capacitors as Resistor Equivalents", Caves, Copeland, Rahim, Rosenbaum, IEEE Journal of Solid-State Circuits, Dec. 1977, vol. SC-12, No. 6.
"MOS Sampled Data Recursive Filters Using Switched Capacitor Integrators", Hosticka, Brodersen, Gray, IEEE Journal of Solid-State Circuits, Dec. 1977, vol. SC-12, #6.
"Potential of MOS Technologies for Analog Integrated Circuits", Hodges, Gray, Brodersen.
"Switched-Capacitor Filters for Telecommunications Applications", Brodersen, Gray, Hodges, Allstot and Jacobs, Dept. of Electrical Engineering & Computer Sciences and the Electronics Research Laboratory, University of California, Berkeley, Calif. 94720.

Primary Examiner—Stanley D. Miller, Jr.
Assistant Examiner—B. P. Davis
Attorney, Agent, or Firm—Stevens, Davis, Miller & Mosher

[57] ABSTRACT

An electronic filter circuit is described having first and second selective circuits each of said selective circuits having an input terminal for receiving an input voltage, each of said selection circuits comprising a first capacitor, an integrator means providing an output signal, switching means for connecting said capacitor alternatively between said input terminal and said integrator output, respectively between a common input-output terminal and said integrator input, in response to a switching signal, further comprising means for providing first and second switching signals to said first and second selection circuits, said signals having the same frequency but differing in phase whereby each of said first and second selective circuits provides for alterate sampling of an input signal and means for combining said integrator means output signals.

6 Claims, 12 Drawing Figures

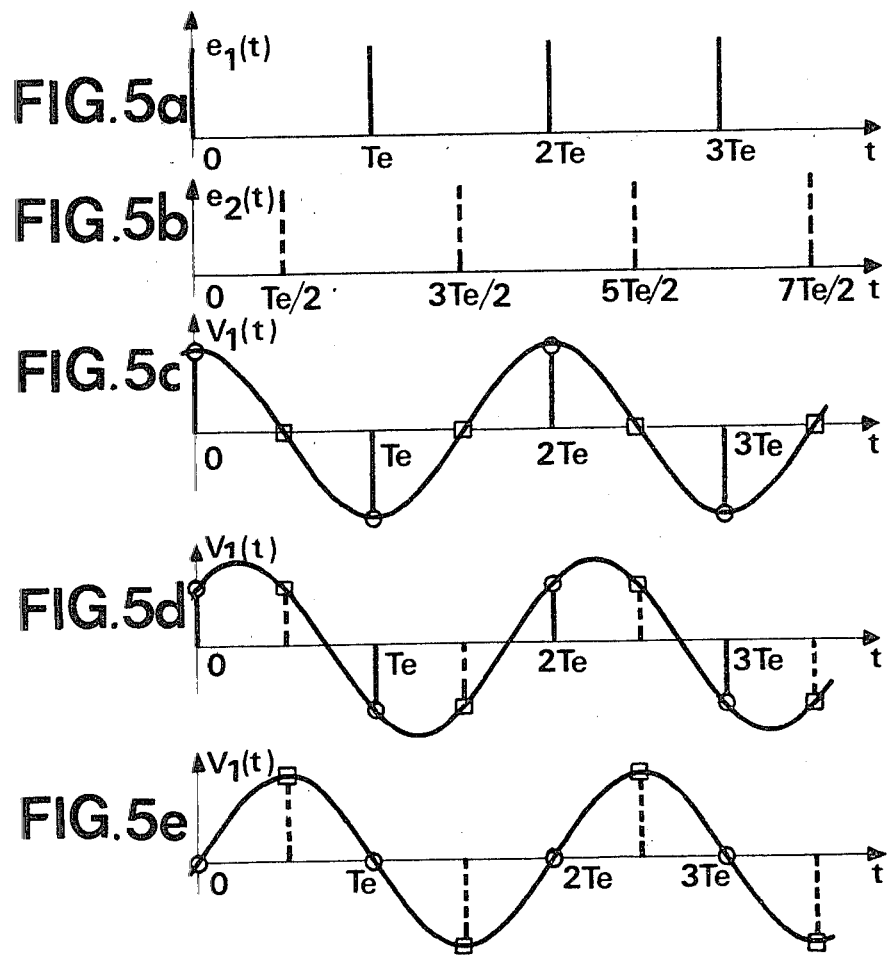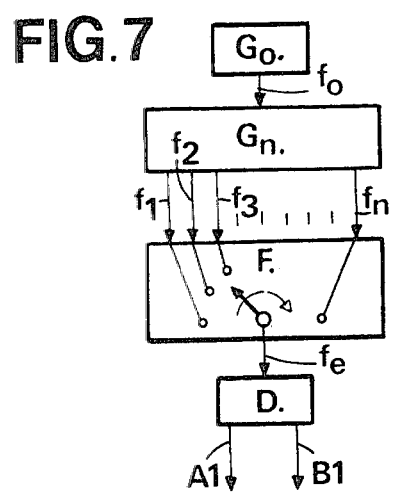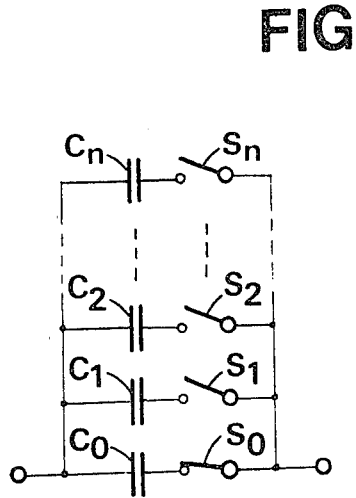

SWITCHED CAPACITANCE SIGNAL PROCESSOR

The present invention concerns an electronic circuit comprising switched capacitors which makes it possible to process an analogue signal and which forms a filter of frequencies.

Circuits having switched capacitors have been achieved basically with a view of being able to incorporate resistances into integrated circuits. Integrates resistances have in general unsatisfactory temperature and accuracy characteristics and occupy too much space within the silicon plate. As shown in FIG. 1, the resistors are replaced by capacitors which are commuted at a given frequency. This capacitor C applied to $V_1$ is charged and after commutation on $V_2$, it is discharged by an amount equal to $Q = C(V_1 - V_2)$.

If the commutation takes place every $T_e$ seconds, then at a connection frequency or sampling frequency $f_e = 1/T_e$, we will have a current towards $V_2$ of average value $i = Q/T_e = C(V_1 - V_2)/T_e$. A resistor equivalent to this connected capacitor would be: $R = T_e/C$. A condition for satisfactory operation requires a sampling frequency $f_e$ much greater than the frequency $f$ of the sampled input signal $V_1$. Generally, $f < f_e/2$ is imposed, in accordance with the laws of sampled systems. Analogue interrupters controlled by digital signals emanating from a clock and represented by the switch K generally ensure this condition.

A circuit using switched capacitors is presented in FIG. 2. It consists of an integrator formed from an operational amplifier I and a capacitance C, of a switched capacitance $\alpha C$ and two switches K. The successive commutations of the switched capacitance $\alpha C$, applied in a first phase to $V_1$ and $V_2$ and in a second phase to the earth and to the negative input of the integrator, correspond to the sampling frequency $f_e$ for an input signal $V_1$ having a frequency $f$. Depending on the value of $\alpha$, the circuit with switched capacitors should behave like a delay circuit ($\alpha = 1$), like a frequency rejection circuit ($0 < \alpha < 1$) or like a frequency emphasizing circuit ($1 < \alpha < 2$) using in these last two cases the resonance of the circuit at $f = (f_e/2)(1+2k)$ with k a whole number. Hence, in both these cases, such a circuit constitutes around the resonant frequency a conventional rejection or a conventional emphasizing circuit and moreover, can be perfectly integrated, especially in C-MOS technology. It is henceforth easy to construct selective filters, which can be integrated and which the sampling frequency can be selected in order to determine the resonant frequency $f = f_e/2$ at which it is desired to work.

Such a selective circuit, especially when used as a band pass filter, presents certain disadvantages.

On the one hand, knowing that the first resonant frequency occurs at $f = f_e/2$, and that it is the theoretical limit for which the input signal is sampled twice each period, an uncertainty occurs, as shown in FIG. 3, according to the relative phase of the input signal $V_1$ in relation to the sampling time. Hence it can happen that the input signal is zero at the moment of sampling, affecting the output signal of the circuit.

On the other hand, the frequencies $f$ of the input signal $V_1$ greater than $f_e/2$ appear on the output transposed below $f_e/2$, which is the case for all the selected circuits, reason for which the spectrum of the input signal is limited to frequencies less than $f_e/2$.

The present invention aims to eliminate these drawbacks and thus to achieve an electronic circuit with switched capacitors, whose input frequencies can vary beyond the resonance frequency $f_e/2$ and hence form a delay circuit, a rejection circuit, or emphasizing circuit which can be perfectly integrated. It should be noted that a solution to this difficulty does exist but whose principle is fundamentally different. This is the question of circuits known as circuits of n paths but which have the drawback of operating at a sampling frequency which is equal to that of the signal to be derived, hence being subject to the parasitic injection of the clock frequency.

The object of the invention is to provide an electronic circuit which consists of at least two selective circuits having switched capacitors as described above arranged in parallel and of a circuit which delivers signals for controlling the switches in order to ensure the successive switching of the switched capacitors, the input signal of the electronic circuit being connected to the inputs of the selective circuits and the ouputs of the selective circuits being connected to an element which forms the output signal of the electronic circuit. Moreover, the circuit which delivers these signals which control the switches consists of a means for actuating the signals in such a manner that each successive switching corresponding to a switched capacitor is phase shifted in time with respect to each successive switching of another switched capacitor.

The following figures illustrate, by way of examples, the invention and the form of its execution.

FIGS. 5a–5e represent the sampling signals $e_1(t)$ and $e_2(t)$ as well as the input signal $V_1(t)$ sampled according to $e_1(t)$ and $e_2(t)$.

FIG. 7 represents a means for generating a sequence of sampling frequencies.

FIG. 8 represents a means for adjusting the value of the capacitances $\alpha C$ or C.

Figure 1:
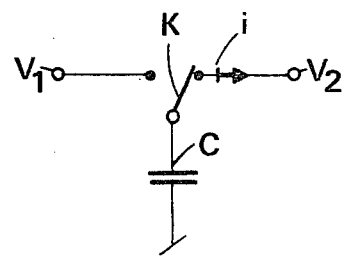
FIG. 1 represents a switched capacitor circuit according to the prior art.
Figure 2:
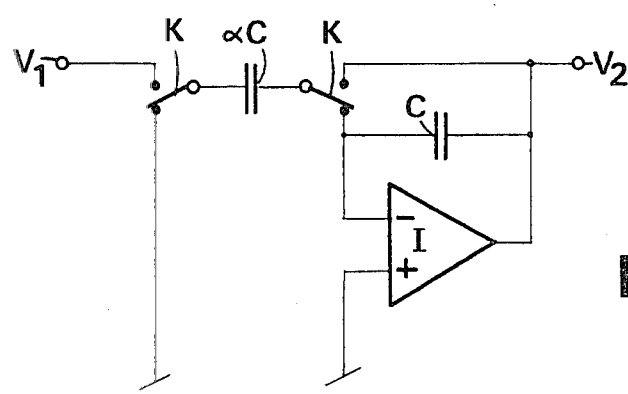
FIG. 2 represents a selective circuit with switched capacitors belonging to the prior art.
Figure 3:
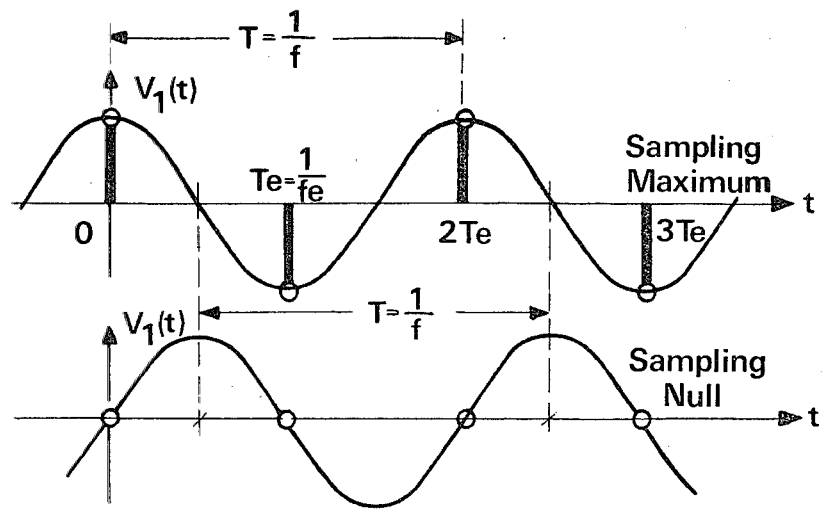
FIG. 3 shows the limits of the sampling of the input signal at a frequency $f_e = 2f$ of the circuit of FIG. 2.
Figure 4:
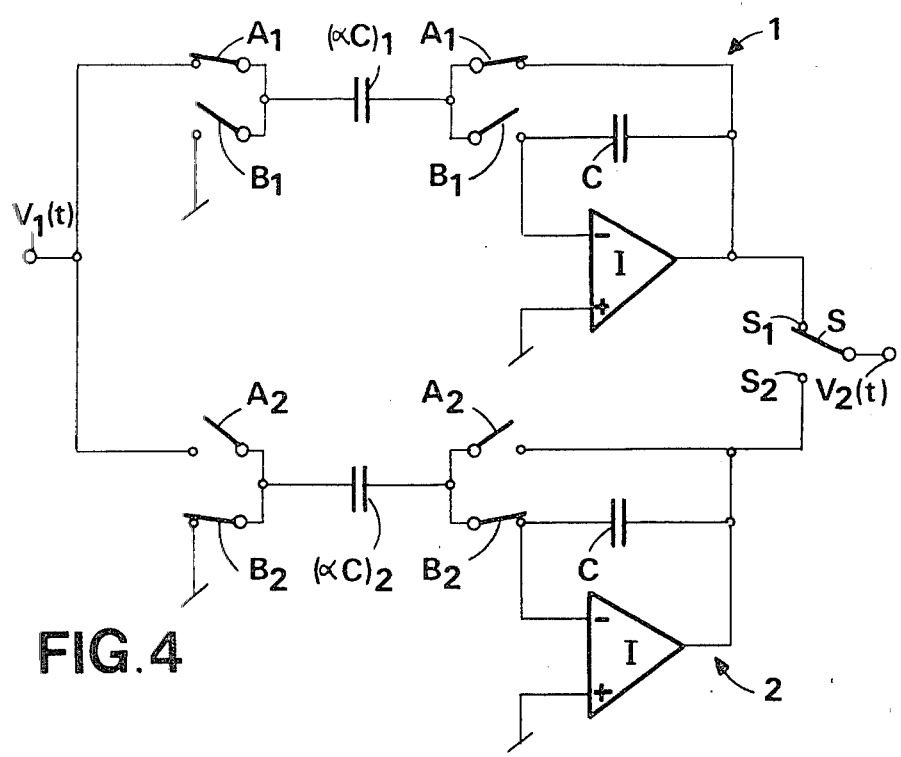
FIG. 4 represents the electronic circuit with switched capacitors according to the embodiment of the present invention.

FIG. 4 presents an electronic circuit with switched capacitors according to one embodiment of the invention. The example is limited to presenting two selective circuits of FIG. 2, the setting of several such selective circuits into cascades otherwise being possible. These two selective circuits are put in parallel and the switches of the switched capacitors $(\alpha C)_1$ and $(\alpha C)_2$ are represented by two pairs of interrupters $A_1$, $B_1$ and two pairs of interrupters $A_2$, $B_2$ respectively.

The object is to sample the input signal $V_1(t)$ at the frequency $f_e$ on the one hand by the first selective circuit 1 and on the other hand by the second selective circuit 2 but in such a manner that the input signal sampled by the selective circuit 2 is phase shifted in relation to the signal sampled by the selective circuit 1. In our example, one-half the sampling period of the input signal is chosen as the phase shift and the frequency of the input signal $V_1(t)$ is one-half the frequency of the sampling signal frequency $f_3$. Everything, therefore, takes place as if the input signal $V_1(t)$ was sampled four times during one period. FIGS. 5a and 5b illustrate this technique and show the sampling $e_1(t)$ and $e_2(t)$ phase shifted by a half period. FIGS. 5c and 5e present the input signal $V_1(t)$ which is sampled when one of the series of samplings is zero, the other series of samplings hence not zero owing to the design of the circuit. Beyond these limits, the circuit is sampled four times per period, as shown in FIG. 5d.

Figure 6:
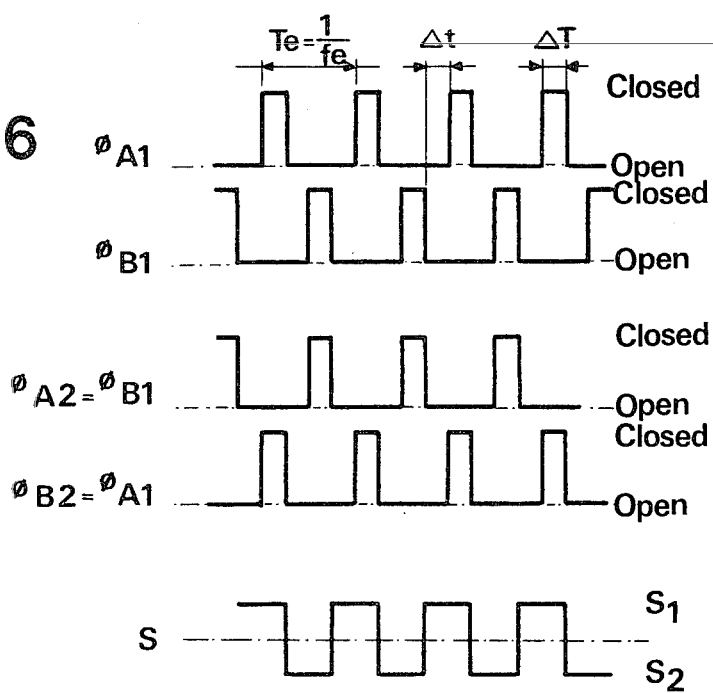
FIG. 6 shows the command signals of the interrupters which provide the commutation as well as the positions of the output switch as a function of these signals.

In order to make this particular sampling possible, it is necessary to guarantee a suitable commutation of the switched capacitors $(\alpha C)_1$, $(\alpha C)_2$. In order to do this, we designate by $\phi_{A1}$, $\phi_{B1}$, $\phi_{A2}$, and $\phi_{B2}$ the signals which control the interrupters $A_1$, $B_1$, $A_2$ and $B_2$, as shown in FIG. 6, it being possible for these interrupters to consist of MOS transistors. In the selective circuit 1, the signal $\phi_{A1}$ controls the two interrupters $A_1$ at a sampling frequency $f_e$ and at each closing of duration $\Delta t$ of the interrupters $A_1$, the selective circuit 1 selects one sample of the input signal $V_1(t)$. The signal $\phi_{B1}$ closes the interrupters $B_1$ at the same frequency $f_e$, but after the opening of the interrupters $A_1$, connecting $(\alpha C)_1$ to the earth and then to the negative input of the operational amplifier I. $\phi_{A1}$ and $\phi_{B1}$, hence ensure by the relative shift of the interrupters $A_1$ and $B_1$ the commutation of $(\alpha C)_1$ and the selection of $V_1(t)$ at the frequency $f_e$, as previously described.

The selective circuit 2 must take samples of $V_1(t)$ which are phase shifted by a half period in relation to the specimens taken by the selective circuit 1. Hence, the signal $\phi_{A2}$ closes the interrupters $A_2$ of the selective circuit 2 when the interrupters $A_1$ of the selective circuit 1 are open, this being at the same frequency $f_e$. Similarly, when the interrupters $A_2$ are open, $\phi_{B2}$ closes interrupters $B_2$ in order to obtain the connection of the capacitance $(\alpha C)_2$. It is ascertained that for $\phi_{A2}$ it is possible to use the signal $\phi_{B1}$ and for $\phi_{B2}$ the signal $\phi_{A1}$, which simplifies the actuation of the control signals of the interrupters $A_1$, $B_1$, $A_2$ and $B_2$.

The signals $\phi_{A1}$, $\phi_{B1}$, $\phi_{A2}$, $\phi_{B2}$ are handled in such a manner that the interrupters $A_1$, $B_1$ and $A_2$, $B_2$ respectively are never closed at the same time and, on the contrary, are open together during $\Delta t$. This duration $\Delta t$ can tend towards zero, increasing the durations of closing $\Delta T$, but must not be zero, hence avoiding any risk of short circuit.

We have seen that the output $V_2(t)$ can be the total of the outputs of each of the selective circuits 1 and 2. Another method, which is more simple, for forming $V_2(t)$ consists of an alternate selection by means of a switch S of the output of the selective circuit 1 then the output of the selective circuit 2, as shown in FIG. 4. In fact, the switch S will be in the position $S_1$ and then in the position $S_2$, connecting the output alternately to one of the two selective circuits 1 and 2, preferably to the one which does not have any transition. FIG. 6 represents the position of the switch S in relation to the signals $\phi_{A1}$ and $\phi_{B1}$, $\phi_{A2}$ and $\phi_{B2}$. Such a switching can also be achieved by a switch pair such as transistors MOS, controlled by suitable signals derived from $\phi_{A1}$ and $\phi_{B1}$ for example.

As has already been mentioned, a fundamental aspect lies in the fact that the resonance frequency is half that of the sampling frequency. This sampling frequency which came from a pilot quartz crystal oscillator makes it possible to obtain considerable stability of the resonance frequency. This stability makes it possible to achieve filters of very low band width which can detect a signal whose frequency can also be determined by a quartz crystal oscillator. The sampling frequency being double that of the input signal, any risk of a parasitic signal injected at the frequency of the input signal is eliminated. Moreover, the setting of several selective circuits into cascades does not present any problems of detuning of one circuit with respect to the other.

The circuit with switched capacitors according to the invention may provide a resonant frequency $f_e/2$ which is directly determined by the sampling frequency $f_e$, independently of the accuracy of the elements of the circuit. Hence, by altering the sampling frequency $f_e$, it is possible to vary the resonant frequency of the electronic circuit of the invention and it is possible to achieve a filter having a frequency characteristic which is variable.

FIG. 7 represents a means which makes it possible to generate a sequence of sampling signals $\phi_{A1}$ and $\phi_{B1}$. The generator $G_o$ generates a pilot frequency $f_o$ which is applied to a frequency generator $G_n$ which gives out different frequencies $f_1$ to $f_n$ which are directly related to $f_o$ by a fixed ratio. A control circuit F hence selects according to a given sequence one of the frequencies $f_1$ to $f_n$ and, hence, determines the sampling frequency $f_e$ according to the said sequence. This frequency $f_e$ will determine through a device D the control signals $\phi_{A1}$ and $\phi_{B1}$. The pilot frequency $f_o$ can be produced by a quartz oscillator and the elements can be achieved by means of logic circuits which can be perfectly integrated, especially in MOS technology.

On the other hand, by varying the capacitors $(\alpha C)_1$, $(\alpha C)_2$ or C, and hence indirectly $\alpha$, the properties of the circuit such as its band width and its amplification are modified. FIG. 8 shows a simple means of varying the value of said capacitors. The capacitance $C_o$ represents the basic value of capacitance $(\alpha C)_1$, $(\alpha C)_2$ or C which can vary by putting the capacitors $C_1$ to $C_n$ in parallel, by means of interrupters $S_1$ to $S_n$. These interrupters can be realized with MOS transistors controlled by logic circuits, the whole of such a system can be an integrated circuit.

Finally, as emerges from the description, the electronic circuit with switched capacitor displays the advantage of being capable of integrating into MOS technology.

What is claimed is:

1. An electronic circuit comprising:

first and second selective means, each of said selective means being commonly connected to a first input terminal for receiving an applied input voltage, each said selective means comprising: a first capacitor, an integrator means having a second input terminal, a common terminal, and an output terminal providing an output signal, and switching means for connecting said capacitor alternatively between said first input terminal and said integrator means output terminal, and between said common terminal and said integrator means input terminal, in response to a switching signal;

means for providing first and second switching signals to said first and second selective circuits, said switching signals having the same frequency but differing in phase whereby each of said first and second selective circuits provides for alternate sampling of an input voltage applied to said first input terminal; and means for combining the output signals at the output terminals of the respective integrator means provided in said first and second selective means.

2. An electronic circuit according to claim 1, further comprising means for varying the frequency of said switching signals.

3. An electronic circuit according to claim 1, wherein each integrator means includes an integrating capacitor.

4. An electronic circuit according to claim 3, further comprising means for varying the value of said integrating capacitors and the value of said first capacitors.

5. An electronic circuit according to claim 1, wherein each selective means further comprises means for discharging said first capacitor in the absence of said switching signal.

6. The electronic circuit of claim 1, wherein said means for combining said integrator means output signals comprises a switch alternately providing a signal from each of said integrator output terminals.

* * * * *